United States Patent [19]

Verbauwhede

[11] Patent Number: 5,732,255
[45] Date of Patent: Mar. 24, 1998

[54] SIGNAL PROCESSING SYSTEM WITH ROM STORING INSTRUCTIONS ENCODED FOR REDUCING POWER CONSUMPTON DURING READS AND METHOD FOR ENCODING SUCH INSTRUCTIONS

[75] Inventor: Ingrid Verbauwhede, Berkeley, Calif.

[73] Assignee: Atmel Corporation, San Jose, Calif.

[21] Appl. No.: 639,780

[22] Filed: Apr. 29, 1996

[51] Int. Cl.$^6$ .................. G06F 9/22; G06F 1/32
[52] U.S. Cl. ...................... 395/598; 395/750.03
[58] Field of Search ................ 395/384, 598, 395/750, 750.03

[56] References Cited

U.S. PATENT DOCUMENTS

| 3,792,441 | 2/1974 | Wymore et al. | 395/598 |
| 4,204,252 | 5/1980 | Hitz et al. | 395/598 |
| 5,274,829 | 12/1993 | Hotta et al. | 395/381 |
| 5,572,736 | 11/1996 | Curran | 395/750.03 |

OTHER PUBLICATIONS

Su et al., Saving Power in the Control Path of Embedded Processors, IEEE Design & Test of Computers, 1994, pp. 24–30.

Su et al., Low Power Architecture Design and Compilation Techniques for High–Performance Processors, IEEE, 1994, pp. 489–498.

J. M. Rabaey, "Digital Integrated Circuits: a design perspective," Prentice Hall, Englewood Cliffs, N.J., 1996, pp. 587, 596–609.

*Primary Examiner*—Richard L. Ellis

[57] ABSTRACT

A digital signal processing system for executing instructions and processing data, including a program memory which stores encoded instructions, where the program memory consumes less power when a bit having a first logical level is read therefrom than when a bit having a second logical level is read therefrom, and where the most commonly read encoded instructions comprise more (and preferably many more) bits having the first logical level than bits having the second logical level. Preferably, the program memory is implemented as a read-only memory (ROM). Other aspects of the invention are a method for generating such encoded instructions and storing the encoded instructions in a ROM, a ROM which stores such encoded instructions, a digital signal processing system having a read-only program memory storing such encoded instructions, and methods for operating such a processing system.

28 Claims, 1 Drawing Sheet

SIGNAL PROCESSING SYSTEM WITH ROM STORING INSTRUCTIONS ENCODED FOR REDUCING POWER CONSUMPTON DURING READS AND METHOD FOR ENCODING SUCH INSTRUCTIONS

FIELD OF THE INVENTION

The invention relates to methods for generating encoded instructions and storing the instructions in a program memory implemented as a ROM (preferably having NOR structure), where the program memory consumes less power when a bit having a first logical level is read therefrom than when a bit having a second logical level is read therefrom, and the encoded instructions consist primarily of bits having the first logical level. The invention also pertains to a ROM which stores such encoded instructions, to a digital signal processing system having a program memory (a ROM) storing such encoded instructions, and to methods for operating such a processing system.

BACKGROUND OF THE INVENTION

Many different implementations of a digital signal processor (DSP) are well known in the art. A conventional DSP typically includes a program memory for storing instructions to be executed, a program control unit for fetching and decoding instructions from the program memory, a data memory for storing data to be processed as a result of executing the instructions (and/or data that has been processed as a result of executing the instructions), and a processing unit (e.g., an arithmetic computational unit). Such a DSP is often implemented as a single integrated circuit (a single chip).

A class of preferred embodiments, the invention is a DSP of the type shown in FIG. 1, whose program memory 4 stores data encoded in accordance with the invention. The DSP of FIG. 1 includes program memory 4, program control unit ("PCU") 2 for fetching and decoding instructions from program memory 4 (thereby generating control signals for controlling execution of the instructions), processing unit 10 for performing operations (e.g., arithmetic computations) on data in response to the control signals from PCU 2, memory management unit (MMU) 3, input/output unit (IOU) 12, and data memory 6 for storing data to be processed (and optionally also data that has been processed) by the DSP as a result of executing the instructions.

Data memory 6 is random access memory (RAM) to which data can be written and from which data can be read, and data memory 6 is connected to address buses AB0 and AB1 and to data buses RB0 and RB1. Data can be transferred from bus RB0 to pipeline register M0, and from register M0 to data bus DB0. Similarly, data can be transferred from bus RB1 to pipeline register M1, and from register M1 to data bus DB1.

Program memory 4 is typically a single port, read-only memory (ROM) which includes means for reading stored data from any selected row of an array of rows and columns of storage locations (preferably, each row comprises locations for storing 32 bits and each column comprises locations for storing 64K words, where "64K" denotes $2^{16}$). An address signal from PCU 2 determines each selected row. PCU 2 asserts a sequence of such address signals (and optionally also, one or more control signals) to memory 4 to trigger the reading of the bits (typically instruction bits) stored in each of a sequence of rows of memory 4.

In preferred embodiments in which data memory 6 is a dual port RAM with an array of storage locations 16 bits wide and 64K words deep, one port of dual port memory 6 can receive a 16-bit address (from 16-bit address bus AB0) and at the same time, the other port of memory 6 can receive another 16-bit address (from 16-bit address bus AB1). Control means are provided so that two simultaneous reads from memory 6, a simultaneous read from and write to memory 6, or a single read from (or write to) memory 6 can be performed.

MMU 3 preferably includes two independent address generation units for generating two address signals (each identifying a memory location in memory 6 for writing data to or reading data from) and asserting such address signals to address buses AB0 and AB1. More specifically, in response to control bits from PCU 2 (which have been generated in PCU 2 by decoding instructions from program memory 4), MMU 3 asserts address signals on address bus AB0 and/or address bus AB1. Data is read from the memory location (in memory 6) identified by each address into pipeline register M0 or pipeline register M1 (or data is written from data bus RB0 and/or data bus RB1 into the memory location identified by each address).

In the DSP of FIG. 1, each of first data bus DB0 and second data bus DB1 is preferably 16 bits wide. In variations on the FIG. 1 system, a DSP programmed to implement the invention can have a single port data memory (rather than a dual port data memory), and single address bus and a single data bus (rather than dual address buses and dual data buses).

PCU 2 includes an instruction fetch means (for fetching instructions from program memory 4), an instruction decode unit, and registers for storing control bits generated in the decode unit (for assertion to MMU 3, data bus DB0, ACU 10, or the instruction fetch means).

IOU 12 includes means for monitoring the addresses on address buses AB0 and AB1 to determine the type of memory access being implemented. IOU 12 sets a flag to PCU 2 if the addresses are outside a predetermined address range (e.g., addresses for an external memory, other than memory 6, accessible through a port connected along bus AB0 and/or AB1). PCU 2 can assert wait states for slower memory accesses in response to such flags.

Program memory 4 is typically a single port ROM comprising an array of rows and columns of memory cells. Each row of cells (storage locations) is indexed by a row address. Each row address (sometimes denoted as an "instruction address") is typically a 16-bit word, and each row typically consists of 32 cells (so that each row stores a 32-bit instruction or other 32-bit word). For example, PCU 2 can include a program counter register which stores a sequence of 16-bit instruction addresses, and an instruction register which receives a 32-bit word (either a data value or an instruction) from program memory 4 in response to each instruction address asserted from the program counter register to memory 4. In the example, to execute a program comprising a sequence of instructions, PCU 2 loads a sequence of 16-bit instruction addresses into the program counter register for addressing program memory 4, and the instruction register receives a sequence of 32-bit words from program memory 4 in response to the addresses (memory 4 asserts one 32-bit word to the instruction register in response to each 16-bit instruction address asserted from the program counter register to memory 4).

As noted, program memory 4 is typically a ROM whose memory cells are organized as an array of 32 columns and 64K rows of cells. For an array of this size, the ROM typically has the conventional NOR structure to be described with reference to FIG. 2. Alternatively (especially where the ROM has a smaller array of memory cells), the ROM can have a pseudo-NMOS NOR or NAND structure.

FIG. 2 represents a portion of a conventional NOR implementation of program memory 4. Only four rows of memory cells are shown in FIG. 2. Each column of cells of the FIG. 2 implementation of memory 4 comprises "X" memory cells (where X is typically equal to $2^{16}$). Each cell that stores a bit indicative of a logical zero (0) is implemented by an N-channel transistor (e.g., transistor N1 of FIG. 2). The drains of all transistors of a column are connected to a common bitline (e.g., one of bitlines BL[0] through BL[31] indicated in FIG. 2). The gate of each of the transistors of a column is connected to a different wordline (e.g., wordline WL[0], WL[1], WL[2], or WL[3] of FIG. 2). The sources of the transistors are held at a source potential (typically ground potential, as shown in FIG. 2). A row of PMOS transistors is also connected along a clock line (labeled "clk" in FIG. 2), with the gate of each PMOS transistor connected to the clock line, the source of each PMOS transistor connected to a supply voltage ($V_{DD}$), and the drain of each PMOS transistor connected to a different one of the bitlines.

The ROM is "programmed" by connecting an NMOS transistor at the location of each cell which stores a bit indicative of a logical zero (as transistor N1 is connected at the cell at the intersection of wordline WL[0] and bitline BL[1]), and by omitting a transistor from the location of each cell which stores a bit indicative of a logical one (e.g., the cell at the intersection of wordline WL[0] and bitline BL[2]).

The following procedure is employed to read a row of cells of a programmed ROM having the FIG. 2 structure. In a pre-charge phase, a low level of a clock signal is asserted to the clock line (labeled "clk" in FIG. 2), which turns on each of the PMOS transistors connected along the clock line, thereby precharging each bitline to a voltage indicative of a logical one. In the pre-charge phase, all the wordlines are held at a low level (to turn off any NMOS transistors whose gates are connected along the wordlines). Then, in an "evaluation" phase, a selected one of the wordlines (the one identified by the currently asserted instruction address) is switched to a high voltage level, thus turning on each NMOS transistor whose gate is connected along the selected wordline. The voltage of the bitline to which each such NMOS transistor is connected is pulled to ground potential (indicative of a logical zero) as current flows through the NMOS which has been switched on (in an alternative ROM implementation known as a "pseudo-NMOS NOR" implementation, during evaluation, the voltage of a bitline to which a transistor is connected is pulled to a value close to ground potential, which value is also indicative of a logical zero). With reference again to the FIG. 2 example, if wordline WL[0] is selected during the evaluation phase, transistor N1 will switch on, and the voltage of bitline BL[1] will undergo a transition to a level indicative of a logical zero as a result of transistor N1 switching on (but the other bit lines will remain at their pre-charge phase voltage which is indicative of a logical one).

The amount of power consumed in repeatedly reading any one row of a ROM having the FIG. 2 structure (over several cycles of the clock signal "CLK") depends on how many NMOS transistors are connected along the wordline corresponding to that row. If the capacity of one bitline is C, the amount of energy consumed to charge and discharge one bitline during one clock cycle (assuming the bitline has an NMOS transistor connected thereto which is switched on and off during the clock signal, and that the wordline is selected during the evaluation phase of the clock cycle) is $$E=(C)(V_{DD})^2$$

For simplicity, a full swing is assumed on the bit line during the clock cycle.

If the bitline switches every clock cycle, the power consumption for one bitline of the row is:

$$P_{one\ bitline}=(C)(V_{DD})^2(f),$$

where f is the clock frequency.

If there are N bitlines and the bit assignment for the row (i.e., the assigned cell states for the row) is random, it follows that (on the average, over many randomly selected bit assignments) half of the bitlines will swing during each clock cycle (since, on the average, half of the cells along the row will have a state or "bit assignment" indicative of a logical one and half of the cells along the row will have a "bit assignment" indicative of a logical zero). Thus, the power consumption for all bitlines of the row (averaged over many randomly selected bit assignments) is $$P_{average}=(C)(V_{DD})^2(f)(N/2).$$

Thus, the power consumption of a ROM having the FIG. 2 structure (averaged over many reads of the same or different rows of the memory cells) will be proportional to the number of bitlines (N), assuming that the bit assignment along each row is random (so that on the average, half the cells comprising each row have a state indicative of a logical one, and half of the cells comprising the row have a state indicative of a logical zero).

The present invention is based on a recognition that such a random bit assignment along each row is undesirable for two reasons.

It is often desirable to implement a ROM with an increased number of columns, e.g., to allow for a larger number of different words to be stored in the ROM (with one word stored in each row, and each word consisting of X bits, where X is the number of columns). However, with a random bit assignment along each row, the average power consumed during reading a sequence of instructions from the ROM will increase (proportionally) as the number of columns is increased. The invention provides an improved encoding for instructions stored in a ROM, which allows the number of columns of the ROM to be increased without significantly increasing the average power consumed during reading a sequence of instructions from the ROM. For example, the invention allows use of a 32-bit wide programmed ROM (storing a 32-bit encoded instruction in each row), rather than a 16-bit wide programmed ROM (storing a 16-bit instruction in each row) as had been more commonly used in the art prior to the invention, without significantly increasing the power required to read each row of the programmed ROM.

Further, even assuming that the number of columns of a ROM is fixed, a random bit assignment along each row results in substantial power consumption during reading of a sequence of instructions from the ROM. This power consumption can be reduced in accordance with the invention if the instructions stored in the ROM (one instruction in each row of the ROM) are encoded in accordance with the invention (below the level of power consumption required to read a sequence of instructions encoded according to a code in which there are, on the average, and equal number of "zero" bits and "one" bits stored in each row of the ROM).

SUMMARY OF THE INVENTION

In preferred embodiments, the invention is a method for generating encoded instructions and storing the instructions in a program memory (preferably implemented as a ROM, such as a ROM having NOR structure), where the program memory consumes less power when a bit having a first logical level is read therefrom than when a bit having a second logical level is read therefrom, and the encoded instructions comprise more (and preferably many more) bits having the first logical level than bits having the second logical level. In other words, less power is consumed to read each memory cell storing a bit indicative of a first logical value than to read each cell storing a bit indicative of a second logical value. When the encoded instructions have been stored in the program memory, the program memory stores encoded instruction bits consisting primarily of bits having the first logical level (indicative of the first logical value) in the sense that more, and preferably many more, cells of the program memory store bits having the first logical level (bits indicative of the first logical value) than bits having the second logical level (bits indicative of the second logical value).

Preferably, the encoded instruction bits are binary bits. Also preferably, one and only one encoded instruction is stored in at least a subset of the rows (e.g., in each row) of the program memory. Also preferably, the most commonly read instructions (the instructions expected to be most commonly read in normal operation of a digital signal processor in which the program memory is installed) are encoded with the greatest ratio of bits having the first logical level to bits having the second logical level (and the least commonly read instructions are encoded with the smallest ratio of bits having the first logical level to bits having the second logical level).

Also within the scope of the invention are methods for operating a digital signal processor having a program memory (preferably implemented as a ROM), where the program memory stores instruction bits encoded in accordance with the invention. Also within the scope of the invention are ROMs which store instruction bits encoded in accordance with the invention, and digital signal processors each including at least one such ROM. One such digital signal processor includes circuitry for executing instructions and thereby processing data, a read-only program memory which stores the instructions (where the instructions have been encoded in accordance with the invention), and a program control unit connected to the program memory for receiving and processing a sequence of the instructions to generate control signals for controlling operation of the system in response to the instructions.

Alternative embodiments of the invention are methods for generating encoded data and storing the encoded data in a program memory implemented as a ROM (preferably having NOR structure), where the program memory consumes less power when a bit having a first logical level is read therefrom than when a bit having a second logical level is read therefrom, and the encoded data comprise more (and preferably many more) bits having the first logical level than bits having the second logical level. The data typically determine (but need not determine) instructions for execution by a digital signal processor.

In a class of preferred embodiments for programming a ROM having a NOR structure (which consumes less power to read a bit indicative of a logical "1" than to read a bit indicative of a logical "0"), the inventive method includes the steps of encoding at least the most commonly used instructions so as to consist of more (preferably many more) binary bits indicative of a logical "1" than bits indicative of a logical "0," and storing such encoded instructions in the ROM having a NOR structure. Some instructions (e.g., the ones expected to be rarely read) can be encoded so as to consist of more binary bits indicative of a logical "0" than bits indicative of a logical "1." Preferably, one and only one encoded instruction is stored in each row of the ROM. In some of these embodiments, each row of the ROM stores one 32-bit encoded instruction. Alternatively, each encoded instruction consists of N binary bits (where N is a number other than 32), of which there are many more "1" bits than "0" bits.

DETAILED DESCRIPTION OF THE PREFERRED EMBODIMENT

In a class of preferred embodiments, the invention is a digital signal processor (DSP) of the type described herein with reference to FIG. 1, in which program memory 4 is a ROM (having NOR structure of the type described with reference to FIG. 2), and in which program memory 4 has been programmed with encoded instructions in accordance with the invention (each encoded instruction consisting of binary bits). Such an implementation of program memory 4 includes an array of rows and columns of memory cells, with each row of cells storing an encoded instruction consisting of 32 bits (with one bit of the encoded instruction stored in each cell of the row). Each row of cells of the ROM can be read in response to an address (and control signals) from PCU 2.

Each time a cell of program memory 4 (a programmed ROM having NOR structure) is read, memory 4 consumes less power in the case that the cell stores an encoded bit indicative of a logical "1," than in the case that the cell stores an encoded bit indicative of a logical "0".

In accordance with the invention, each of the most commonly used instructions (each of the instructions expected to be most commonly read and executed during operation of the DSP) is encoded so as to consist of more (preferably many more) binary bits indicative of a logical "1" than binary bits indicative of a logical "0." For example, those instructions which often appear in loops, in repeat instructions, or in heavily used subroutines, should be encoded to consist of more bits indicative of a logical "1" than bits indicative of a logical "0." However, instructions which appear only at the start or the end of a program or in rarely used subroutines (e.g., error handling routines) can be encoded to consist of more bits indicative of a logical "0" than bits indicative of a logical "1." The expected usage of each instruction can be determined by profiling the application programs to be executed.

After the encoding step, program memory 4 is programmed by storing one of the encoded instructions in each row thereof. Preferably, one and only one encoded instruction is stored in each row of memory 4. In preferred implementations, each row of memory 4 is 32-bits wide (i.e., each row of memory 4 consists of 32 memory cells) and stores one 32-bit encoded instruction.

Figure 1:
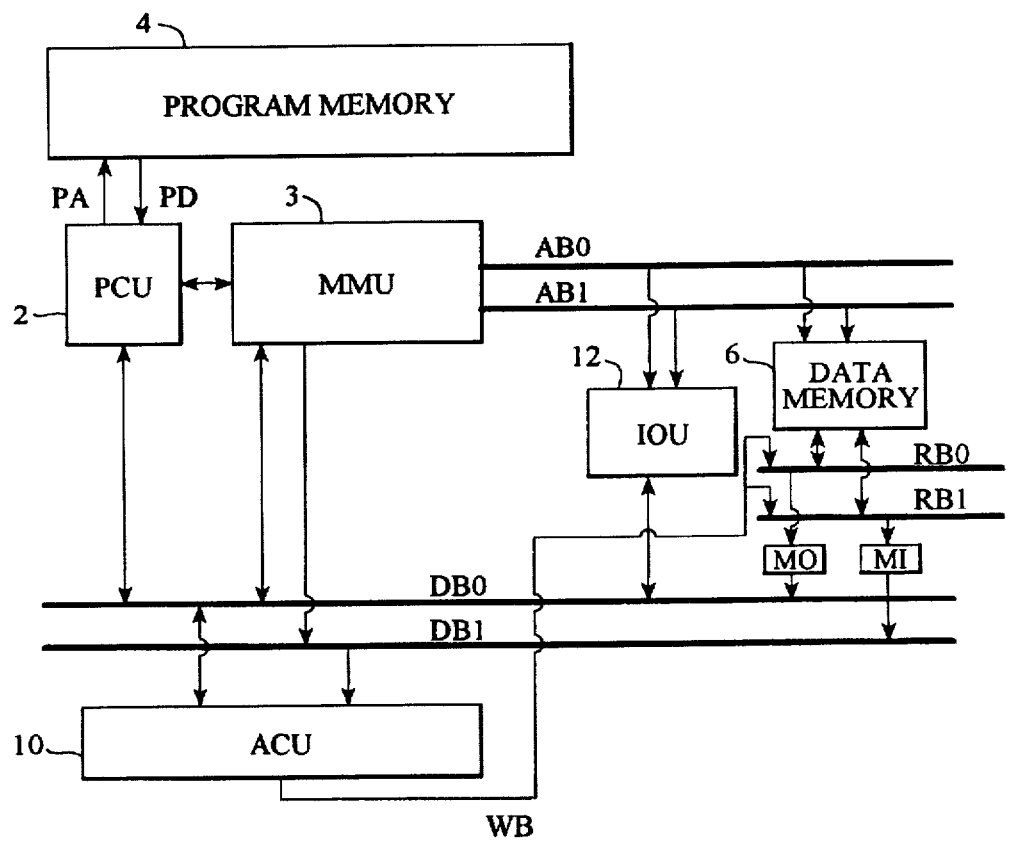
FIG. 1 is a schematic block level diagram of a digital signal processing system (DSP) which includes program memory 4 implemented as a ROM.
Figure 2:
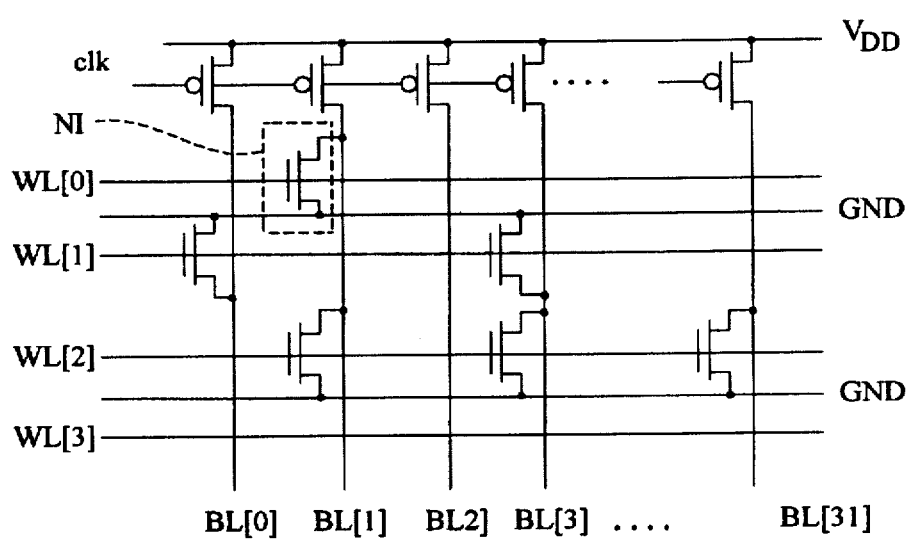
FIG. 2 is a schematic diagram of a portion of a preferred implementation of program memory 4 of FIG. 1.

For example, consider a basic "multiply-accumulation" instruction which can be executed by the FIG. 1 system to implement the operation "a0=a0+(*r0)(*r1)," said operation consisting of multiplying two data words (identified, respectively, by addresses in registers *r0 and *r1 within MMU 3 of FIG. 1) and adding the contents of an accumulator register "a0" (e.g., an accumulator register a0 within ACU 10 of FIG. 1) to the product of the two words. An example of a 32-bit instruction specifying this instruction, which is encoded in accordance with the invention and stored in one row of program memory 4, is: 10110011111001111111011111111111. This encoded instruction consists of an ordered sequence of six "0" bits and twenty-six "1" bits.

Preferably, those of the encoded instructions (stored in program memory 4) which are expected to be more commonly read from the program memory are encoded with higher ratios of "1" bits (bits whose level is indicative of logical one) to "0" bits (bits whose level is indicative of logical zero) and those of the encoded instructions expected to be less commonly read from the program memory are encoded with lower ratios of "1" bits to "0" bits. For example, the encoded instruction (stored in program memory 4) which is expected to be most commonly read from the program memory during operation of the overall system is preferably encoded as a sequence of thirty-two "1" bits, each of the thirty-two encoded instructions (stored in memory 4) which are expected to be the next most commonly read from the program memory during operation of the system preferably comprises thirty-one "1" bits and one "0" bit, and each of the encoded instructions (stored in program memory 4) which are expected to be least commonly read from the program memory during operation of the system is preferably encoded as a sequence of seventeen "1" bits and fifteen "0" bits. Of course, if necessary to encode a large number of instructions (where constraints mandate a maximum number of bits for each encoded instruction), the instructions that are expected to be used least often can be encoded as sequences of more "0" bits than "1" bits (if these rarely used instructions are statistically used in a small percentage of instruction reads, the invention still results in a net power savings over the prior art).

Alternatively, each encoded instruction consists of N binary bits (where N is a number other than 32), of which there are more "1" bits than "0" bits, and each row of memory 4 consists of N memory cells.

Another aspect of the invention is the programmed memory 4 itself (a memory whose cells are programmed with instructions encoded in accordance with the invention).

Also within the scope of the invention are methods of operating the DSP of FIG. 1, when the program memory of the DSP has previously been programmed with instructions encoded in accordance with the invention. Such an operating method includes the steps of reading a sequence of the encoded instructions from the program memory (e.g., by operating PCU 2 to receive a sequence of the encoded instructions from the program memory 4), executing the instructions to process data (e.g., operating PCU 2 to generate control signals for controlling operation of the DSP in response to the instructions read from the program memory, and processing in ACU 10 pairs of data words read from data memory 6 in response to the control signals), and optionally storing the processed data (e.g., in data memory 6).

In preferred implementations of the above-described DSP, program memory, and method, the instructions expected to be most commonly read in normal operation of the DSP (in which the programmed ROM is installed) are encoded with the greatest ratio of "1" bits to "0" bits (and the instructions expected to be least commonly read are encoded with the smallest ratio of "1" bits to "0" bits). For example, those instructions which often appear in loops, in repeat instructions, or in heavily used subroutines, should be encoded to consist of many more bits indicative of a logical "1" than bits indicative of a logical "0." However, instructions which appear only at the start or the end of a program or in rarely used subroutines (e.g., error handling routines) can be encoded to consist of more bits indicative of a logical "0" than bits indicative of a logical "1."

Other embodiments of the inventive method accomplish programming of a ROM with specially encoded words consisting of bits (preferably binary bits). The encoded words typically determine (but need not determine) instructions for execution by a digital signal processor. The ROM can be of any type which consumes less power to read a bit having a first logical level than to read a bit having a second logical level. In accordance with the invention, the data (or only the data expected to be most frequently read) are encoded so as to consist of more (preferably many more) bits having the first logical level than bits having the second logical level, and the encoded data are stored in the ROM. For example, the ROM can be programmed (where it has NOR structure) by connecting an NMOS transistor in each cell that is to store a bit having the first logical level (in the same manner as transistor N1 is connected in its cell as shown in FIG. 2).

The programmed ROM stores encoded instruction bits consisting primarily of bits having the first logical level (in the sense that more, and preferably many more, cells of the ROM store bits having the first logical level than bits having the second logical level). Preferably, one and only one encoded instruction is stored in each row of the ROM. Preferably, the most commonly read instructions (the instructions expected to be most commonly read in normal operation of a digital signal processor in which the programmed ROM is installed) are encoded with the greatest ratio of bits having the first logical level to bits having the second logical level (and the least commonly read instructions are encoded with the smallest ratio of bits having the first logical level to bits having the second logical level).

Also within the scope of the invention are methods for operating a digital signal processor having a program memory implemented as a ROM (where the ROM has been programmed in accordance with any embodiment of the inventive method). Also within the scope of the invention is a programmed ROM which has been programmed in accordance with any embodiment of the inventive method, and a digital signal processor including at least one such programmed ROM.

Preferred embodiments of the method and system of the invention have been described with reference to FIGS. 1 and 2. Although these embodiments have been described in some detail, it is contemplated that many changes from (and variations on) these embodiments can be made without departing from the spirit and scope of the invention as defined by the appended claims.

What is claimed is:

1. A digital signal processing system, including:
   a program memory which stores encoded instructions consisting of instruction bits, where the program memory consumes less power when a bit having a first logical level is read therefrom than when a bit having a second logical level is read therefrom, where each of the encoded instructions comprises M bits having the first logical level and N bits having the second logical level, where N and M are integers, and thus said each of the encoded instructions determines a ratio, M/N, of bits having the first logical level to bits having the second logical level, and where those of the encoded instructions more commonly read from the program memory are encoded with higher values of said ratio, and those of the encoded instructions less commonly read from the program memory are encoded with lower values of said ratio; and a program control means for receiving a sequence of the encoded instructions from the program memory and generating control signals in response to the encoded instructions.

2. The system of claim 1, wherein the program memory is a read-only memory having NOR structure which consumes less power to read a bit indicative of a logical one than to read a bit indicative of a logical zero.

3. The system of claim 2, wherein the program memory has rows and columns of memory cells, and one and only one of the encoded instructions is stored in each of at least a subset of the rows.

4. The system of claim 3, wherein each of the rows consists of thirty-two of the memory cells, and each of the encoded instructions consists of thirty-two instruction bits.

5. The system of claim 1, wherein the program memory is a read-only memory.

6. The system of claim 5, wherein the program memory has rows and columns of memory cells, and one and only one of the encoded instructions is stored in each row of at least a subset of the rows.

7. The system of claim 6, wherein each of the rows consists of thirty-two of the memory cells, and each of the encoded instructions consists of thirty-two instruction bits.

8. The system of claim 1, also including:

a processing means for receiving a subset of the control signals from the program control means and processing data in response to said subset of the control signals.

9. A read-only program memory, comprising:

an array of memory cells arranged in rows and columns, wherein each of the cells stores a bit, wherein less power is consumed to read each of the cells storing a bit indicative of a first logical value than to read each of the cells storing a bit indicative of a second logical value, wherein the cells of at least a subset of the rows store encoded data words, wherein each of the encoded data words comprises M bits having the first logical level and N bits having the second logical level, where N and M are integers, and thus said each of the encoded data words determines a ratio, M/N, of bits having the first logical level to bits having the second logical level, and wherein those of the encoded data words more commonly read from the program memory are encoded with higher values of said ratio, and those of the encoded data words less commonly read from the program memory are encoded with lower values of said ratio.

10. The program memory of claim 9, wherein one and only one of the encoded data words is stored in each row of said subset of the rows.

11. The program memory of claim 9, wherein the encoded data words are encoded instructions, and each of the bits comprising each of the encoded instructions is a binary bit.

12. The program memory of claim 11, wherein the program memory is a read-only memory having NOR structure, and wherein less power is consumed to read each of the cells storing a bit indicative of a logical one than to read each of the cells storing a bit indicative of a logical zero.

13. The program memory of claim 12, wherein each of the encoded instructions comprises more bits indicative of a logical one than bits indicative of a logical zero.

14. The program memory of claim 11, wherein one and only one of the encoded instructions is stored in each row of said subset of the rows.

15. The program memory of claim 14, wherein each of the rows consists of thirty-two of the memory cells, and each of the encoded instructions consists of thirty-two instruction bits.

16. A method for operating a digital signal processing system, said system including a program memory which consumes less power when a bit having a first logical value is read therefrom than when a bit having a second logical value is read therefrom, said system also including a program control means for receiving encoded instructions from the program memory and generating control signals in response to the encoded instructions, said method including the steps of:

(a) programming the program memory to store a set of the encoded instructions, wherein those of the encoded instructions stored in the program memory which are more commonly read from the program memory are encoded with higher ratios of bits having the first logical value to bits having the second logical value, and those of the encoded instructions stored in the program memory which are less commonly read from the program memory are encoded with lower ratios of bits having the first logical value to bits having the second logical value; and (b) after step (a), reading a sequence of the encoded instructions from the program memory and operating the program control means to generate control signals for controlling operation of the system in response to said sequence of the encoded instructions.

17. The method of claim 16, wherein the system also includes a processing means, and wherein the method also includes the step of:

(c) supplying at least a subset of the control signals generated in step (b) to the processing means, and operating the processing means to process data in response to said subset of the control signals.

18. The method of claim 16, wherein the program memory is a read-only memory having NOR structure which consumes less power to read a bit indicative of a logical one than to read a bit indicative of a logical zero.

19. The method of claim 18, wherein each of said encoded instructions stored in the program memory in step (a) comprises more instruction bits indicative of a logical one than instruction bits indicative of a logical zero.

20. The method of claim 16, wherein the program memory has rows and columns of memory cells, and step (a) includes the step of storing one and only one of the encoded instructions in each of at least a subset of the rows.

21. The method of claim 20, wherein each of the rows consists of thirty-two of the memory cells, and each of the encoded instructions stored in each of said subset of the rows consists of thirty-two instruction bits.

22. A method for generating encoded data and storing the encoded data in a program memory, where the program memory is of a type which consumes less power when a bit having a first logical value is read therefrom than when a bit having a second logical value is read therefrom, said method including the steps of:

(a) generating a set of encoded data words, where those of the encoded data words expected to be more commonly read from the program memory are encoded with higher ratios of bits having the first logical value to bits having the second logical value, and those of the encoded data words expected to be less commonly read from the program memory are encoded with lower ratios of bits having the first logical value to bits having the second logical value; and (b) storing the set of encoded data words in the program memory.

23. The method of claim 22, wherein the program memory is a read-only program memory comprising an array of memory cells arranged in rows and columns, wherein each of the cells stores a bit, and wherein step (b) includes the step of:

storing one and only one of the encoded data words in each row of at least a subset of the rows.

24. The method of claim 22, wherein the encoded data words are encoded instructions for execution by a digital signal processor, and each of the encoded instructions consists of binary bits.

25. The method of claim 24, wherein the program memory is a read-only memory having NOR structure, said read-only memory comprises an array of memory cells arranged in rows and columns, and less power is consumed to read each of the cells storing a bit indicative of a logical one than to read each of the cells storing a bit indicative of a logical zero.

26. The method of claim 25, wherein each of the cells stores one of the binary bits, and wherein step (b) includes the step of:

storing one and only one of the encoded data words in each row of at least a subset of the rows.

27. The method of claim 26, wherein each of the rows consists of thirty-two of the cells, and each of the encoded instructions consists of thirty-two instruction bits.

28. The method of claim 24, wherein each of the encoded instructions comprises more bits having the first logical value than bits having the second logical value.

* * * * *